United States Patent
Chae et al.

(10) Patent No.: US 8,197,660 B2
(45) Date of Patent: Jun. 12, 2012

(54) ELECTRO CHEMICAL DEPOSITION SYSTEMS AND METHODS OF MANUFACTURING USING THE SAME

(75) Inventors: Moosung Chae, Poughkeepsie, NY (US); Bum Ki Moon, LaGrangeville, NY (US); Sun-Oo Kim, Hopewell Junction, NY (US); Danny Pak-Chum Shum, Poughkeepsie, NY (US)

(73) Assignee: Infineon Technologies AG, Neubiberg (DE)

( * ) Notice: Subject to any disclaimer, the term of this patent is extended or adjusted under 35 U.S.C. 154(b) by 979 days.

(21) Appl. No.: 11/852,910

(22) Filed: Sep. 10, 2007

(65) Prior Publication Data

US 2009/0068771 A1 Mar. 12, 2009

(51) Int. Cl.
*C25D 5/00* (2006.01)
(52) U.S. Cl. ............................................ 205/97; 205/96
(58) Field of Classification Search ............... 205/96, 205/97; 204/230.2, 230.7
See application file for complete search history.

(56) References Cited

U.S. PATENT DOCUMENTS

| | | | |
|---|---|---|---|
| 6,103,085 A | 8/2000 | Woo et al. | |
| 6,193,860 B1 * | 2/2001 | Weling | 204/230.2 |
| 6,251,236 B1 | 6/2001 | Stevens | |
| 6,254,742 B1 | 7/2001 | Hanson et al. | |
| 6,258,220 B1 | 7/2001 | Dordi et al. | |
| 6,270,647 B1 * | 8/2001 | Graham et al. | 205/99 |
| 6,391,168 B1 * | 5/2002 | Ueno | 204/242 |
| 6,497,801 B1 * | 12/2002 | Woodruff et al. | 204/230.2 |
| 6,585,876 B2 | 7/2003 | Dordi et al. | |
| 6,811,669 B2 | 11/2004 | Gonzalez, Jr. et al. | |
| 7,147,760 B2 | 12/2006 | Woodruff et al. | |
| 7,435,323 B2 * | 10/2008 | Basol et al. | 205/93 |
| 7,727,364 B2 * | 6/2010 | Singh et al. | 204/230.7 |
| 2005/0067290 A1 * | 3/2005 | Bonkass et al. | 205/84 |
| 2007/0072413 A1 | 3/2007 | Choi et al. | |

* cited by examiner

*Primary Examiner* — Luan Van
(74) *Attorney, Agent, or Firm* — Slater & Matsil, L.L.P.

(57) ABSTRACT

An electro chemical deposition system is described for forming a feature on a semiconductor wafer. The electro chemical deposition is performed by powering electrodes that includes a cathode, an anode and a plurality of electrically independent auxiliary electrodes.

20 Claims, 11 Drawing Sheets

ELECTRO CHEMICAL DEPOSITION SYSTEMS AND METHODS OF MANUFACTURING USING THE SAME

TECHNICAL FIELD

The present invention relates generally to the manufacture of semiconductor devices, and more particularly to electro chemical deposition systems and methods of manufacturing semiconductor devices using electro chemical deposition systems.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

Success of the semiconductor industry requires delivering higher performance at lower cost. Consequently, maintaining production costs within reasonable levels is one of the primary challenges in semiconductor manufacturing.

Improving product quality is another challenge in manufacturing semiconductor devices. For example, depositing thin films involves the challenge of maintaining a uniform deposition rate (both across wafer and within wafer) along with directional deposition for filling high aspect ratio features (ratio of depth of feature to the feature's width) such as vias and trenches. As feature sizes are continually scaled along with wafer size, there exists a continuous need to improve film deposition techniques.

Deposition equipment thus needs to reduce production cost, for example, by lowering processing time (or by increasing through-put) and by lowering down time (or maintenance time), while at the same time improving product quality. Continued success of the semiconductor industry requires overcoming these and other limitations.

SUMMARY OF THE INVENTION

In various embodiments, the invention describes the fabrication of an integrated circuit using an electro chemical deposition system, the electro chemical deposition system comprising a workpiece holder connected to a first voltage source, a bottom electrode connected to a second voltage source disposed below the substrate, and at least one auxiliary electrode disposed between the bottom electrode and the workpiece holder, the auxiliary electrode connected to at least one third voltage source and comprising a plurality of openings.

The foregoing has outlined rather broadly features of an embodiment of the present invention. Additional features in various embodiments of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 which includes FIGS. 1a and 1b, illustrates an embodiment of the invention, wherein

FIG. 3, which includes

FIG. 4, which includes

FIG. 8, which includes FIG. 9, which includes

Corresponding numerals and symbols in different figures generally refer to corresponding parts unless otherwise indicated. The figures are drawn to clearly illustrate the relevant aspects of the embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of preferred embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The invention will now be described with respect to preferred embodiments in a specific context, namely a method for forming semiconductor structures using an electro chemical deposition process. In one embodiment, the present invention uses an auxiliary electrode in an electro chemical deposition system to improve processing time or deposition rate without significantly reducing across wafer variation.

Electro chemical deposition systems are commonly used to deposit thin layers of materials in semiconductor manufacturing. One of the challenges of electro chemical deposition (ECD) systems involves improving deposition metrics such as deposition rates, directionality of deposition, uniformity of film, etc., while minimizing production costs such as costs arising from replacement of parts and equipment down times. Typical ECD processes involve a compromise between the two.

In a typical electro chemical deposition system, a workpiece (wafer) to be coated is mounted on a cathode holder in an electro chemical deposition chamber. A thin seed layer is deposited first over the workpiece to enable electrical contact across the surface of the entire workpiece, thus forming a cathode on the workpiece. The chamber further contains an electrolyte disposed over an anode. The workpiece is immersed into an electrolyte that comprises metallic ions to be deposited. The electrolyte is continuously circulated into the electro chemical deposition chamber. A potential difference is developed across the chamber by biasing or powering the anode and cathode. The potential difference drives the metal ions to the cathode and starts an electrochemical deposition at the cathode, as per the electrochemical reaction: $M^{n+}+ne^-\rightarrow M$. The reaction denotes the formation of metal M on the surface of the wafer, by reducing the charged metallic ion $M^{n+}$ with electrons from the cathode and the electrolyte.

The deposition rate on a flat substrate, for example, given by the Volmer-Butler equation, is proportional to the concentration of the metal ions at the cathode/electrolyte interface, the equilibrium current at the cathode (or exchange current), and the overpotential (potential difference between the electrodes). The exchange current defines the net rate of deposition in the absence of an external electric potential, and primarily depends on the system (electrolyte, metal being deposited, etc.). Further, in a typical ECD system, additives and inhibitors are added for filling high aspect ratio features. The additives, such as accelerators and inhibitors, selectively adsorb on the top surfaces and control the number of available sites for deposition. The concentration of the metal ions at the cathode/electrolyte interface depends on the diffusion and field driven drift of the metal ions from the bulk electrolyte to the cathode/electrolyte interface. Modern ECD systems include a flow regulator or a diffuser to control the concentration of the metal ions flowing into the cathode/electrolyte interface. However, changes in the electric potential still play the critical parameter in controlling the deposition rate. The electric potential changes the electro chemical reaction by changing the net free energy of the reaction. Hence, changes in the electric potential result in an exponential change in the deposition rate.

The workpiece contacts the cathode around the corners or outer regions of the workpiece. Consequently, the electric potential in the inner regions of the workpiece may be reduced due to ohmic loss arising from resistance of the conductive path. The resistance of the conductive path depends on the lowest resistive path from the outer electrically contacted regions to the inner regions. Before the start of the electro chemical deposition process, the seed layer forms this conductive path. The resistance of the seed layer depends inversely on the thickness of the seed layer. Consequently, in deeply scaled technologies, as the thickness of the seed layer decreased to fill high aspect ratio features, the resistance of the seed layer increases. This increased seed layer resistance manifests as a larger potential drop from the outer regions to the inner regions of the workpiece. Hence, in conventional ECD systems, the deposition rate of copper is non-uniform, resulting in a non-uniform across wafer deposition. Such non-uniform filling may result in increased production costs due to poor across wafer yield. Similarly, redesign of the equipment to overcome these limitations can be expensive.

Hence, methods that simultaneously improve film deposition and production costs without compromising deposition quality or yield are needed.

In preferred embodiments, the present invention discloses the use of auxiliary electrodes in electro chemical deposition systems for enhancing film deposition and/or decreasing production costs. In a particular embodiment, the auxiliary electrodes may be used to increase the deposition rate uniformity of the ECD process. For example, the auxiliary electrode may increase the electrode over potential (or potential drop) in regions selectively, and thus increase deposition rate.

Although explained in a particular embodiment, as will be evident, concepts of the invention can be applied, to other techniques. For example, the invention is applicable to other applications that use electro-deposition such as corrosion resistance, as well as depositions using electro-less plating.

Figure 6A:
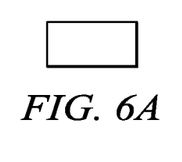
FIGS. 6a-6h, illustrate top cross sections of the auxiliary electrode of the electrochemical deposition system in various embodiments of the invention, wherein the alternate embodiments illustrate different geometric features of the zones.
Figure 6B:
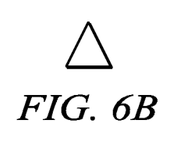
Figure 6C:
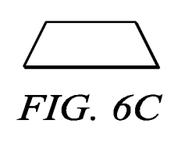
Figure 6D:
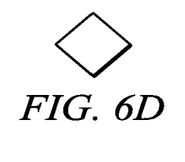
Figure 6E:
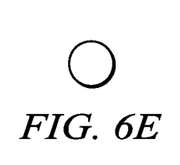
Figure 6F:
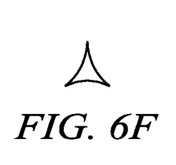
Figure 6G:
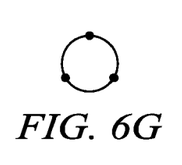
Figure 6H:
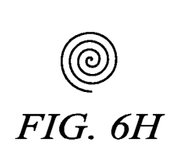
Figure 7:
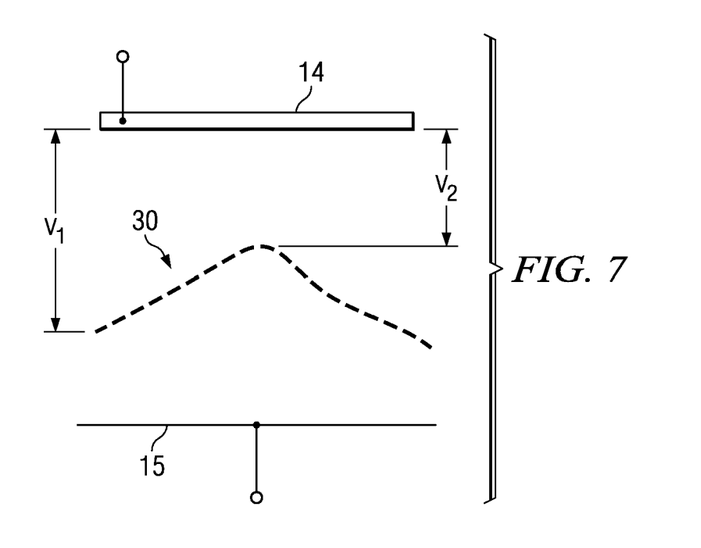
FIG. 7, illustrates the electrochemical deposition system in an embodiment of the invention, wherein the embodiment illustrates a different configuration of the auxiliary electrode.

An embodiment of the invention is illustrated in FIG. 1 and various embodiments using these concepts will then be described using FIGS. 3-7 and the electro chemical deposition systems of FIG. 7. FIG. 8 illustrates the use of embodiments of the invention in fabricating a semiconductor device.

Figure 1A:
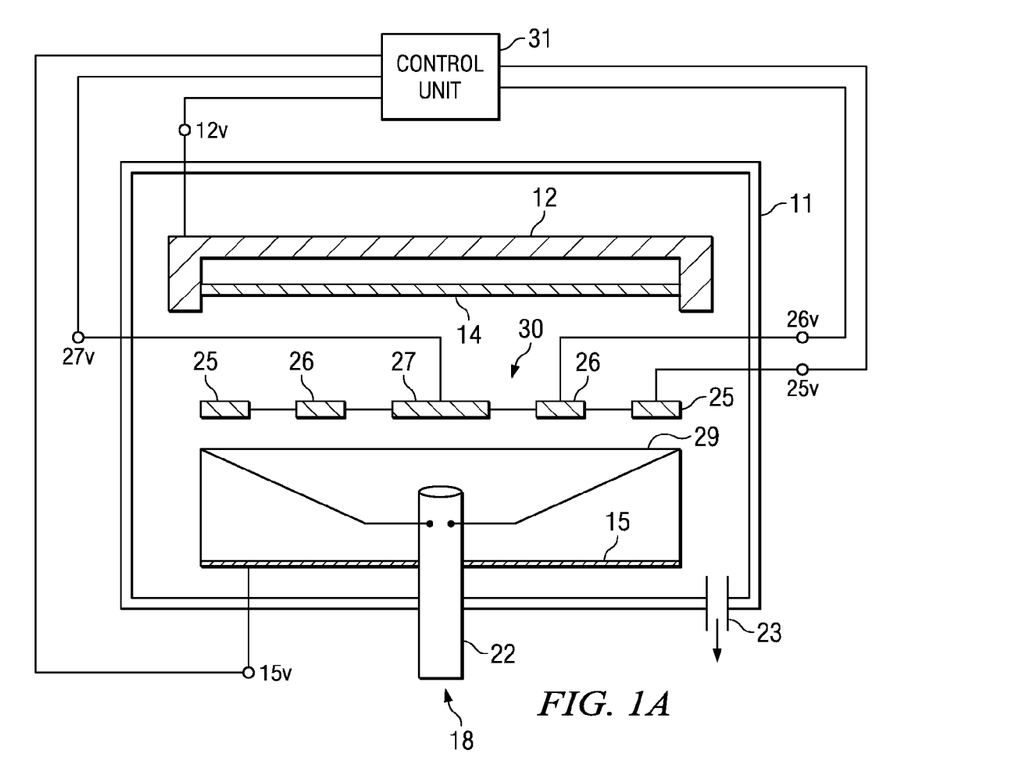
FIG. 1a shows a cross section of an electro chemical deposition system.
Figure 1B:
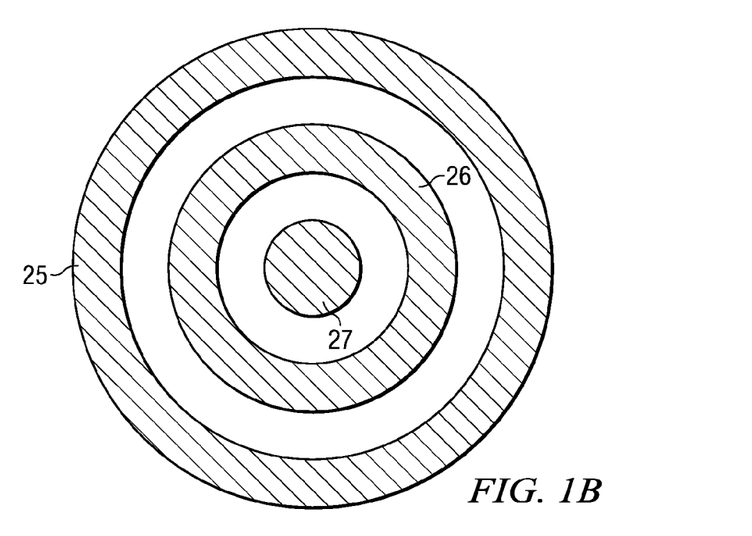
FIG. 1b shows a top cross section of auxiliary electrodes used in the electro chemical deposition system.

FIG. 1, which includes FIGS. 1a and 1b, illustrates an embodiment of the invention, wherein FIG. 1a shows a cross section of an electro chemical deposition system, and FIG. 1b shows a top cross section of the electro chemical deposition system.

Referring to FIG. 1a, the electro chemical deposition system is disposed in a chamber 11 and comprises a workpiece holder 12 connected to a first potential source 12v, an anode 15 connected to a second potential source 15v, a plurality of auxiliary electrodes 30 disposed between the workpiece holder 12 and the anode 15. Each of the auxiliary electrodes 30 comprises independent electrical zones 25-27, the zones connected to an independent potential 25v-27v. A wafer or workpiece 14 may be mounted on the workpiece holder 12. The workpiece 14 is mounted on the corners of the wafer and avoids damaging sensitive regions of the wafer. The electro chemical deposition system further comprises an electrolyte 18 flowing in through an inlet 22 and flowing out through outlet 23. The electrolyte flows into a diffuser 29 disposed above the anode 15. The metal is deposited by an application of a suitable potential to the workpiece holder 12, anode 15 and auxiliary electrode 30. All the electrodes comprising the workpiece 12, anode 15 and auxiliary electrodes 30 are connected to a main control unit 31.

The metal to be deposited may comprise copper, gold, silver, chromium, rhodium, nickel, zinc, etc. The electrolyte typically comprises a metal to be deposited and may comprise copper, gold, silver, chromium, rhodium, nickel, zinc, etc. In some embodiments, the deposited metal may be an alloy comprising a combination of metals. The electrolyte preferably is a compound dissolved in a solution. For example, for depositing copper, a copper sulphate may be deposited in water.

The electrolyte performs a number of functions besides being a source of the metal or metals. For example, the electrolyte may comprise components that form complexes with ions of the deposition metal, maintain a suitable conductivity, stabilize the solution against, for example, hydrolysis, work as a buffer and stabilize the pH, regulate the physical form of the deposit, for example, maintain super-fill effect when filling vias of different configurations, aid in dissolving the anode 15, as well as suitably modify other properties, either of the solution or of the deposit.

The anode 15 may replenish the depleting electrolyte and hence be a consumable anode 15 or it may be inert. The anode 15 may comprise copper, gold, silver, platinum, tungsten, and combinations thereof.

The diffuser 29 enables a uniform flow of electrolyte to the surface of the workpiece 14. Hence, in a limited way the diffuser 29 can help minimize, for example, variations across wafer. The diffuser may be designed to control both the electrolyte 18 flow as well as the electric field lines which determine the potential drop between the anode 15 and the workpiece 14.

FIG. 1b, illustrates the independent electrical zones 25-27 in a top cross sectional view of the auxiliary electrode 30. Each electrical zone 25-27 may comprise a suitable structure and may create a uniform electric field around the zone.

The auxiliary electrode 30 in preferred embodiments comprises the same materials as the anode 15. However, in some embodiments, the auxiliary electrode 30 comprises other materials. For example, in some embodiments, the auxiliary electrode 30 may be made of a consumable electrode, whereas the bottom electrode may not be consumable. Such a design may be advantageous to avoid expensive replacement of the bottom electrode, while using the auxiliary electrode 30 to partially replenish the electrolyte during deposition. The auxiliary electrode 30 in various embodiments comprises copper, gold, silver, platinum, tungsten, and combinations thereof.

In preferred embodiments, the auxiliary electrodes 30 are designed to minimize resistance to the flow of the electrolyte 18. However, in some embodiments, the auxiliary electrodes 30 may also be used as a flow regulator to control the flow of the electrolyte across the surface of the workpiece 14. Even though, the auxiliary electrode 30 is disposed over the diffuser 29 in the preferred embodiment, in various embodiments, the auxiliary electrode 30 may also be attached to the diffuser 29. In some embodiments, the auxiliary electrode 30 may also be located in a different location in the chamber 11. In various embodiments, for a particular product, the auxiliary electrodes 30 may be altered to maximize, for example, product yield. The use of separate auxiliary electrodes 30 allows easy redesign of the potential on the workpiece 14 without expensive redesigns.

An embodiment of the invention for a method of manufacturing semiconductor devices will now be described using FIGS. 2 and 3. The current method describes the electrochemical deposition process for forming. For example, copper metal lines and vias used in manufacturing integrated circuits. The flow chart of FIG. 2 will be described using FIG. 3. In particular, FIG. 3a shows different zones on the surface of a wafer or workpiece 14, and FIG. 3b illustrates the formation of film using the ECD process in the absence of auxiliary electrodes, resulting in non-uniform film deposition. FIG. 3d illustrates overcoming the limitations shown in FIG. 3b, resulting in a tunable film thickness across multiple zones of the wafer, using the auxiliary electrode shown in FIG. 3c.

Figure 2:
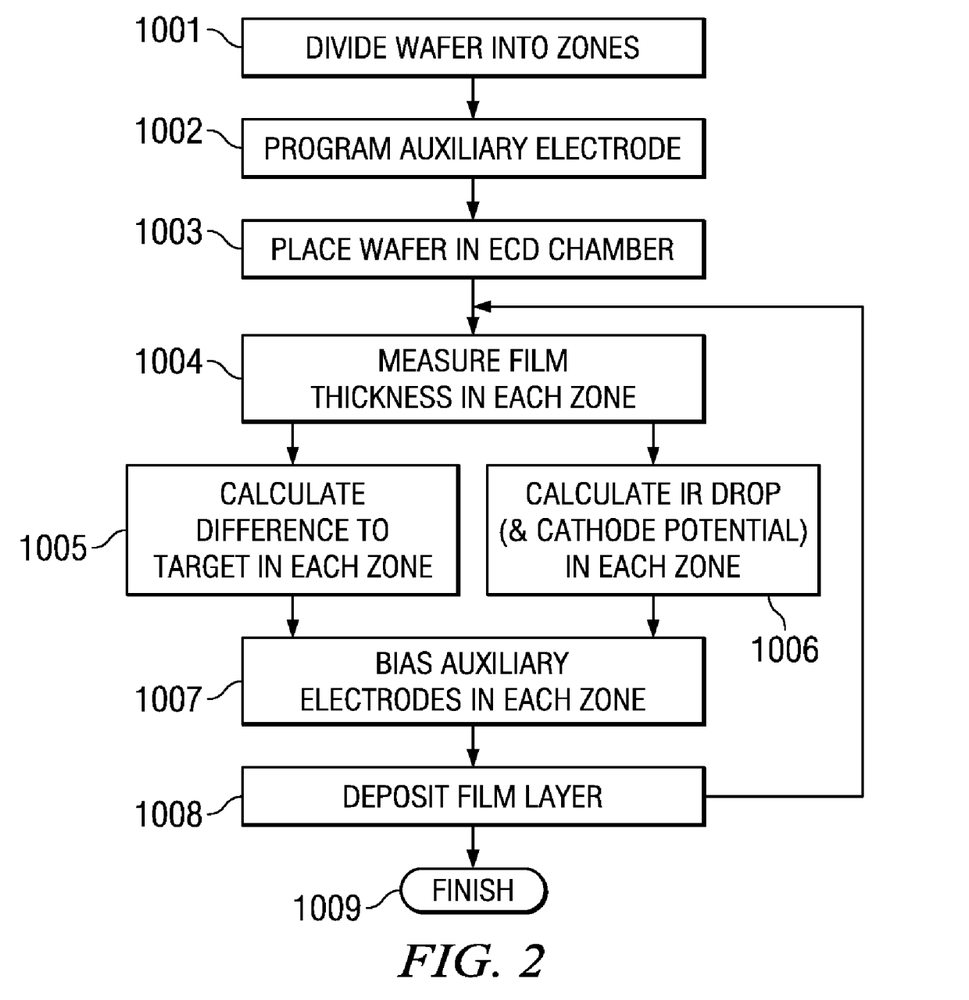
FIG. 2, illustrates a flow diagram of one implementation in an embodiment of the invention.
Figure 3A:
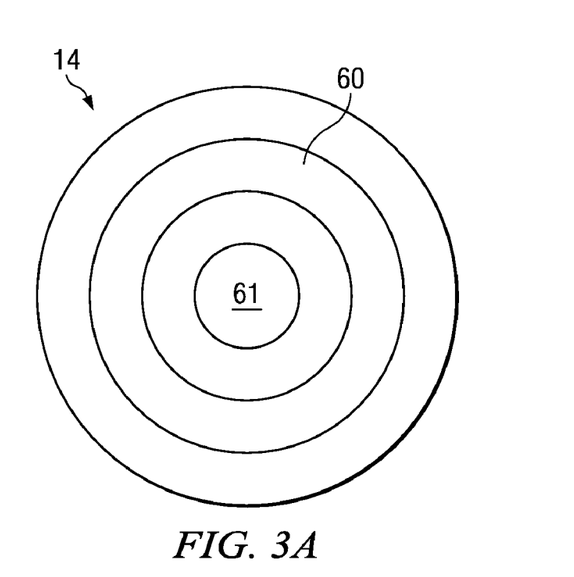
FIGS. 3a-3d, illustrates an embodiment of the invention implementing a method for deposition using an electro chemical deposition system.
Figure 3B:
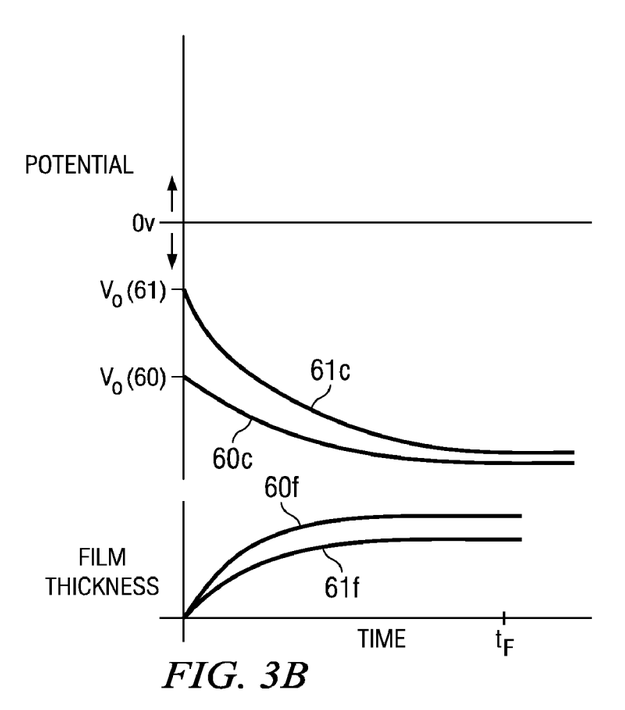

As shown in FIG. 2, box 1001, the wafer or workpiece is divided into a number of zones. The zones are preferably divided in a concentric manner although in some embodiments, the zones may not be concentric. This is shown in FIG. 3a, which refers to the workpiece 14 comprising zones 60 and 61. Zones 60 and 61 are coated with a seed layer for subsequent electrochemical deposition. Zones 60 and 61 could be any zone on the surface of the workpiece 14. In various embodiments, these could be control structures or dummy structures intentionally added into the product design for controlling the ECD process.

Figure 3C:
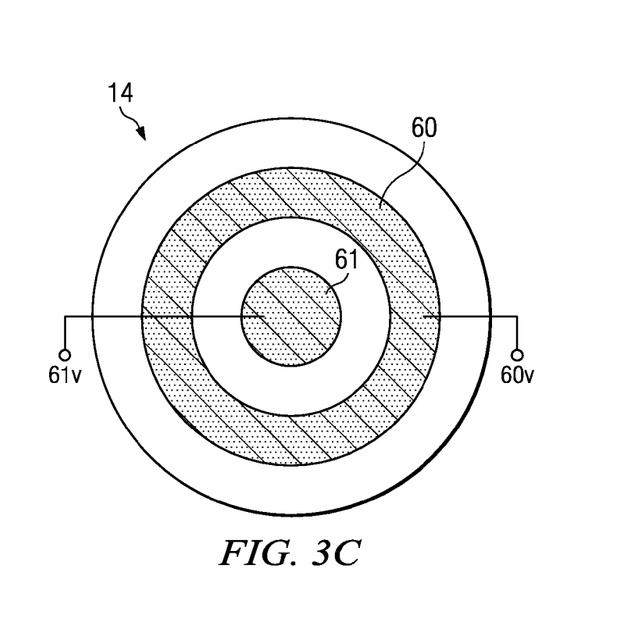
Figure 3D:
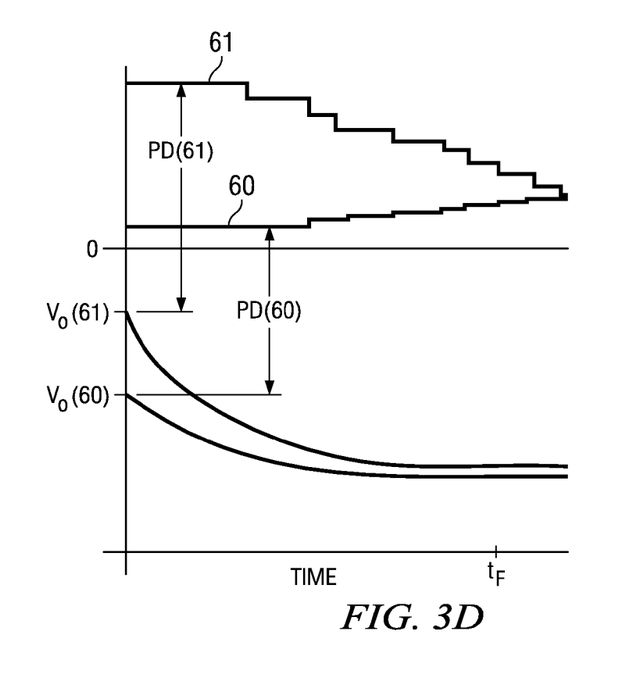

For clarity, FIG. 3b, illustrates film growth in the absence of the auxiliary electrodes. As shown in FIG. 3c, zones 60 and 61 have different cathode potentials (potential on the workpiece) at a start time (t=0). In particular, the zone 61 represented by curve 61c has a cathode potential $V_0(61)$ at t=0, whereas the zone 60 represented by curve 60c has a cathode potential $V_0(60)$ at t=0. The difference in cathode potential $(V_0(60)-V_0(61))$ between the zones 60 and 61 arises from a difference in resistance between the node 12v of FIG. 1a and the respective region. The resistance of the film is reduced as the film increases in thickness. Hence, the cathode potential increases. If no additional auxiliary electrode 30 potential is applied, the grown film (film thickness after end time $t_f$) in such a scenario maps the difference in the initial potential. Hence, after completion of the electrochemical deposition, the film in zone 60 (shown by curve 60f) is thicker than the film in zone 61 (shown by curve 61f). This non-uniform film thickness can be deleteriously magnified during subsequent processing, for example, during planarization steps (e.g., copper CMP) and may result in across wafer yield loss.

As shown in box 1002 of FIG. 2, the auxiliary electrode 30 is tailored or programmed for a specific product design. In the embodiment shown in FIG. 3c, the auxiliary electrode 30 comprises zones 60 and 61 connected to independent voltage sources 60v and 61v respectively. In other embodiments, generic designs for the auxiliary electrode 30 (as will be discussed in later embodiments) may also be used. In various embodiments, these generic auxiliary electrodes may be programmed at the beginning of an ECD process run for processing a number of wafers comprising similar product designs.

FIG. 3d, along with the flowchart of FIG. 2 (boxes 1003-1009), illustrates an embodiment of the invention, wherein the auxiliary electrode 30 is biased based on a criterion. As shown in box 1001 of FIG. 2, the wafer is divided into a plurality of zones or regions corresponding to the zones on the auxiliary electrode. The thickness of the film in each zone is measured at the start time (t=0). At the start of the process, this is typically the seed layer thickness. The thickness may be calculated either optically using techniques such as ellipsiometry or electrically using the current flow in the auxiliary electrodes 30. Based on the thickness of the seed layer, a workpiece potential for each zone is calculated. The zones in the auxiliary electrode 30 are biased, for example, to match the electrochemical potential difference PD(61) and PD(60) between the cathode and the anode in the zones 60 and 61. The measured film thickness in each zone along with a target film thickness is used to calculate a target growth rate for each zone. The potential of the auxiliary electrodes in each zone is adjusted to enable deposition at the target growth rate. After a certain time, the above steps (measurement, calculation of target growth rate and cathode potential, biasing of auxiliary electrode) may be repeated till the final thickness is achieved. In FIG. 3d, the time evolution of the above steps for zones 60 and 61 is shown for the cathode potential V(60) and V(61), the auxiliary potential (A(60) and A(61)) (shown in FIG. 4a) and the potential difference PD(60) and PD(61).

Figure 4A:
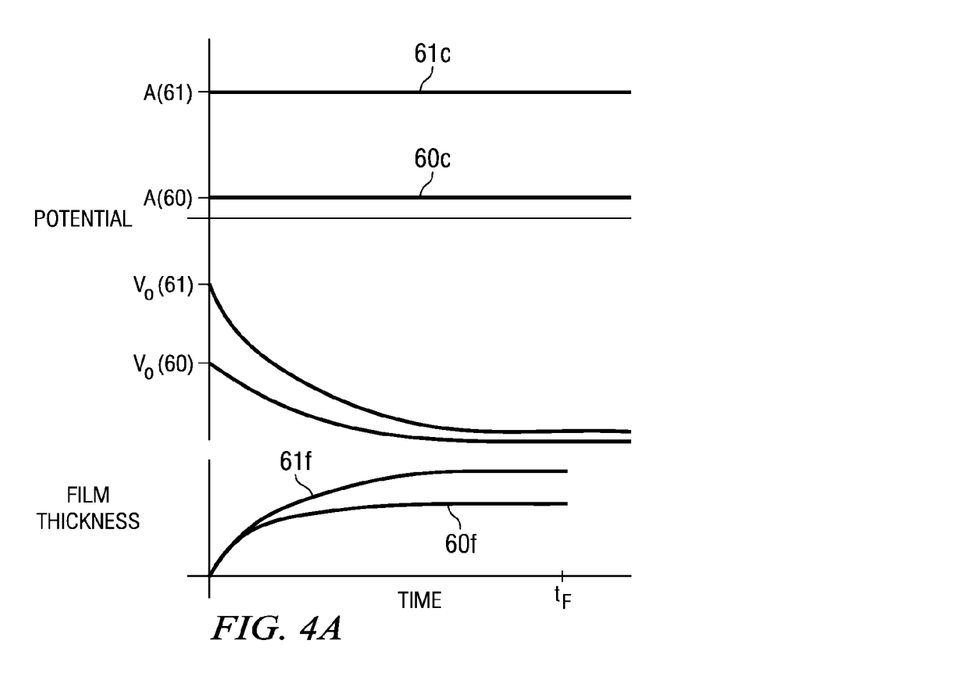
FIGS. 4a and 4b, illustrates an embodiment of the invention implementing a method for deposition using an electro chemical deposition system.
Figure 4B:
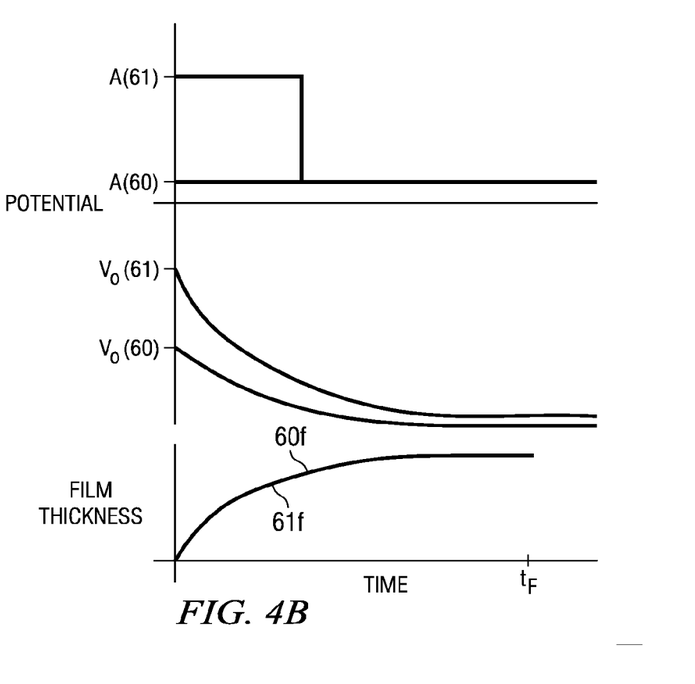

As will be illustrated in various embodiments in FIGS. 4a and 4b, the film thickness in any zone may be tailored to meet a target requirement. For example, the target film thickness may be non-uniform to account for non-uniformity of subsequent processes. In one particular example, the planarization step following electrochemical deposition typically thins wafer edges faster than the wafer center. Hence, the electrochemical deposition may be tailored to deposit a thinner film in the center and a thicker film towards the edge of the wafer.

FIG. 4a, illustrates an embodiment in which the target film thickness in zone 60 of workpiece 14 is larger than the target film thickness in zone 61 of workpiece 14. However, in the embodiment shown in FIG. 4a, at start time, the workpiece potential of zone 60 is higher than the workpiece potential of zone 61. Hence, using the flowchart of FIG. 2, a constant potential is applied in the zones 60 and 61. As the potential on zone 61 is larger than the potential on zone 60, the film thickness in zone 60 is larger than the film thickness in zone 61. The larger potential of the auxiliary electrodes 30 in the zone 61 compensates for its lower cathode potential.

FIG. 4b, illustrates an embodiment in which the target film thickness in zone 60 is the same as the target film thickness in zone 61. However, in the embodiment shown in FIG. 4b, at start time, the workpiece potential of zone 60 is higher than the workpiece potential of zone 61. Hence, using the flowchart of FIG. 2, the potential applied in the zones 60 and 61 is varied until a similar film thickness is obtained. As the potential on zone 61 is larger than the potential on zone 60, at the beginning the film thickness in zone 60 is larger than the film thickness in zone 61. However, as the film thickness increases, the potential drop between the two zones reduces, and hence the potential of the auxiliary electrode on zone 61 may be progressively reduced.

Figure 5A:
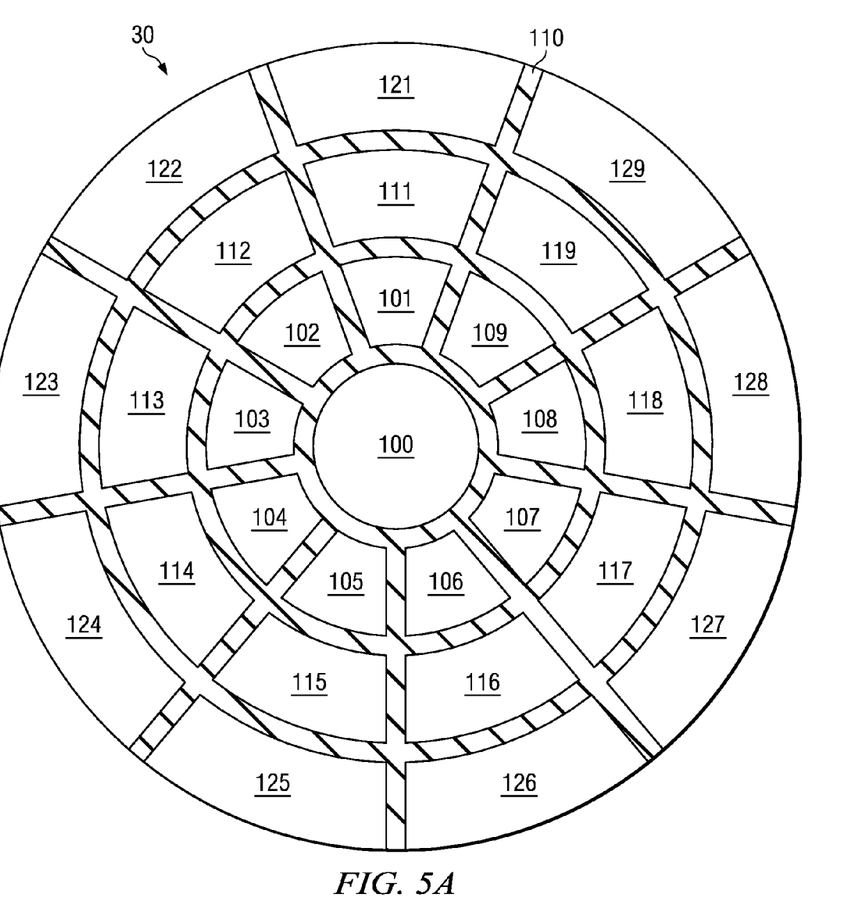
FIGS. 5a-5c, illustrate cross sections of the auxiliary electrode of the electrochemical deposition system in various embodiments of the invention, wherein the different embodiments illustrate the auxiliary electrode comprising a plurality of electrically independent zones.
Figure 5B:
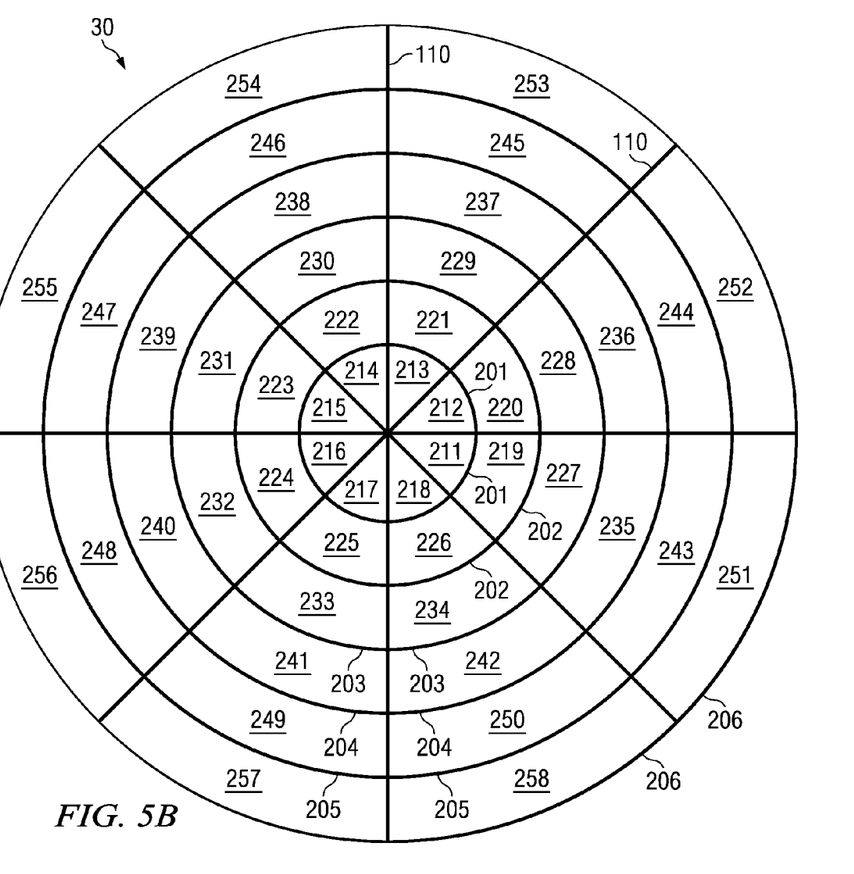

Embodiments of the invention illustrating the auxiliary electrode will now be described using FIG. 5, which includes FIGS. 5a and 5b, showing top cross-sectional views of the auxiliary electrode and FIG. 5c which illustrates a cylindrical plate auxiliary electrode.

Referring now to FIG. 5a, the auxiliary electrode 30 comprises a number of electrically independent zones 100-109, 111-119, and 121-129. The electrically independent zones are separated by a suitable insulator 110. Each zone may be biased by an independent electrical source (not shown). The electrically independent zones 100-109, 111-119, and 121-129 are positioned in concentric zones and separated axially. Although in the described embodiment only four concentric layers are illustrated, more or fewer concentric zones may be formed in various embodiments.

Referring now to FIG. 5b, the auxiliary electrode 30 comprises electrically independent zones 210-258 separated by a suitable insulator 110. Each zone may be biased by an independent electrical source (not shown). The electrically independent zones 210-258 are positioned in concentric zones 201-206. Although in the described embodiment only six concentric layers are illustrated, more or fewer concentric zones may be formed in various embodiments. The auxiliary electrode 30 is separated axially into 8 zones, although in other embodiments more or fewer axial zones may be present.

Figure 5C:
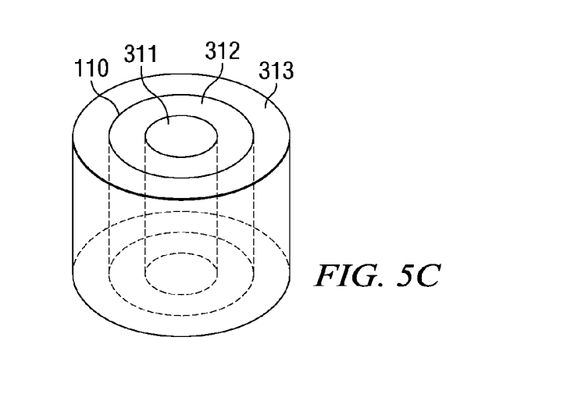

FIG. 5c, illustrates an embodiment wherein the auxiliary electrode 30 is formed as a cylindrical plate. For example, in FIG. 5c, the electrical independent zones 311-313 form the auxiliary electrode 30.

Figure 9A:
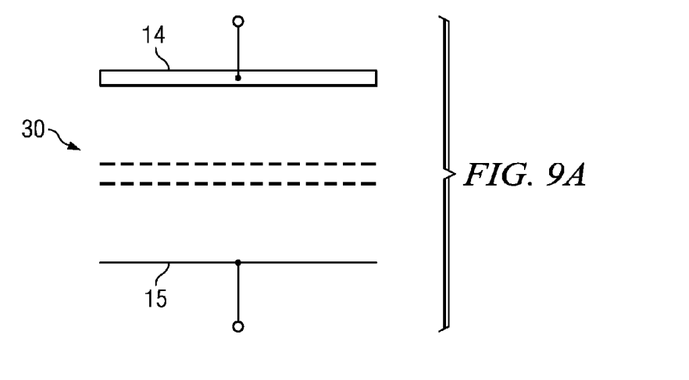
FIGS. 9a-9c, illustrates the electrochemical deposition system in an embodiment of the invention, wherein the embodiment illustrates stacked mesh layers.
Figure 9B:
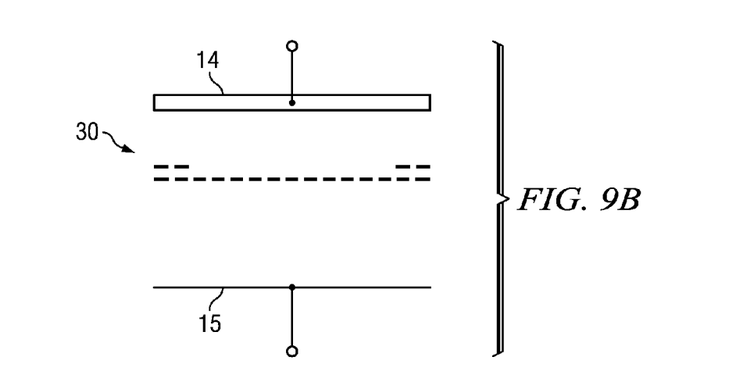
Figure 9C:
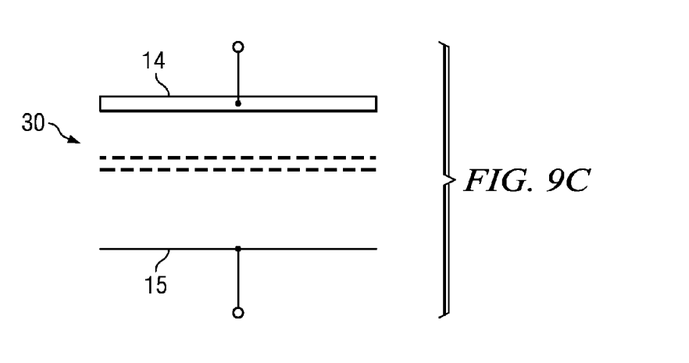

In various embodiments, the auxiliary electrodes 30 may comprise stacked mesh layers or stacked layers (FIG. 9a). In some embodiments, the number of such mesh layers may vary across the auxiliary electrodes 30 (FIG. 9b). For example, the central regions of the auxiliary electrodes 30 may comprise more mesh layers than the edges of the auxiliary electrodes 30. Similarly, different layers of the auxiliary electrodes 30 may be staggered (FIG. 9c).

Embodiments of the invention illustrating the zones comprising the auxiliary electrodes 30 will now be described using FIG. 6. As shown in FIG. 6, which comprises FIGS. 6a-6h, each zone may comprise any shape or pattern. In a preferred embodiment, the shape and pattern are selected to minimize any hindrance to the flow of electrolyte through the auxiliary electrode. Hence, the zones in the auxiliary electrodes 30 have a mesh or grid shape as illustrated in the various embodiments of FIG. 6. In different embodiments, the mesh comprises a network of connectors. The connector may comprise suitable curve elements of varying widths and spacings. For example, the mesh pattern may be a square (FIG. 6a), a triangle (FIG. 6b), a trapezoid (FIG. 6c), a rhombus (FIG. 6d), an ellipse (FIG. 6e), a concave surface (FIG. 6f), a convex surface (FIG. 6g), or a spiral (FIG. 6h). Similarly, the mesh may comprise combinations of one or more of these embodiments. Although not shown, the mesh may comprise any suitable shape in various embodiments.

An embodiment of the electrochemical deposition system is shown in FIG. 7. FIG. 7 shows a workpiece holder holding a workpiece 14 disposed above the anode 15. The auxiliary electrodes 30 are positioned between the anode 15 and the workpiece 14. However, the distance from the auxiliary electrodes 30 to the workpiece 14 can be modified by changing, for example, the geometry of the auxiliary electrodes 30. For example, in FIG. 7, the auxiliary electrodes 30 are modified such that the center is closer than the edges. Hence, the effectiveness of the auxiliary electrode 30 increases due to increased penetration of the electric field lines from the auxiliary electrode 30. In other words, the potential drop across the electrolyte varies, about linearly, as a function of the thickness of the electrolyte. Using this embodiment, a single potential source may be used to modulate the potential on the workpiece 14. In different embodiments, this variation in geometry may be combined with multiple zones to have an optimized control of the cathode potential across the workpiece 14.

Embodiments of the invention may be applied to minimize variations caused by changes in pattern density. A typical wafer comprises a number of zones of varying pattern density. The presence of dense patterns (for example, vias) increases the resistance, and hence potential drops in zones locally around these dense patterns. Embodiments of the methods described herein may be suitably adopted to incorporate such location variations in resistance.

An embodiment of the invention describes a method using the electrochemical deposition system to fabricate a semiconductor device 600. A sequence of process steps used in the formation of the semiconductor device 600 will now be described.

Figure 8A:
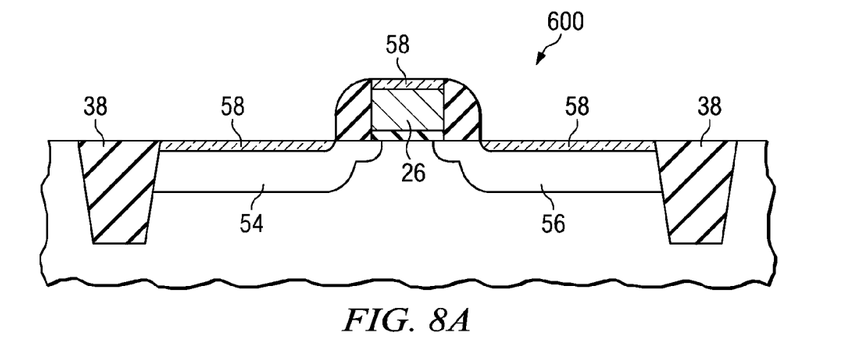
FIGS. 8a-8e, illustrates cross sections of a semiconductor during fabrication, in accordance with embodiments of the invention.

As illustrated in FIG. 8a, the device 600 first goes through front end processing that includes formation of all the active components including gate stack 26, STIs 38, source/drain zones 54 and 56, and silicide zones 58. After forming the front end components, the device 600 undergoes back end of the line manufacturing, wherein contacts are made to the semiconductor body and interconnected using metal lines and vias. Modern integrated circuits incorporate many layers of vertically stacked metal lines and vias (multilevel metallization) that interconnect the various components in the chip.

Figure 8B:
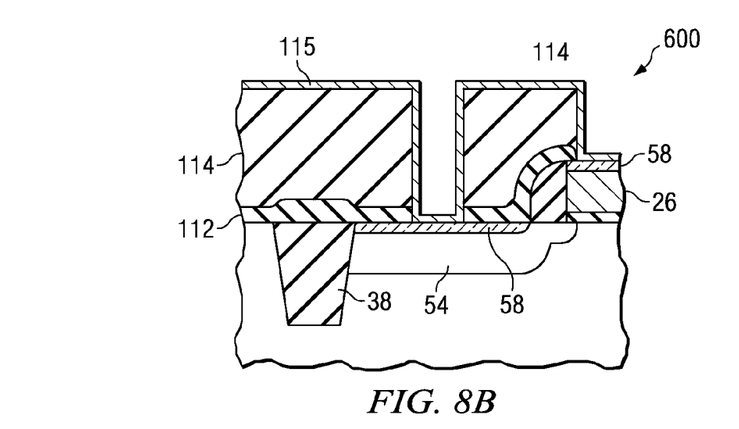

Referring now to FIG. 8b, a first insulating material layer 114 is then formed over a etch stop liner 112. The etch stop liner 112 is deposited over the semiconductor body. For example, a nitride film (e.g., silicon nitride) is deposited. The first insulating material layer 114 preferably comprises insulating materials typically used in semiconductor manufacturing for inter-level dielectric (ILD) layers, such as $SiO_2$, tetra ethyl oxysilane (TEOS), fluorinated TEOS (FTEOS), doped glass (BPSG, PSG, BSG), organo silicate glass (OSG), fluorinated silicate glass (FSG), spin-on glass (SOG), SiN, SiON, low k insulating materials, e.g., having a dielectric constant of about 4 or less, or combinations or multiple layers thereof, as examples, although alternatively, the first insulating material layer 114 may comprise other materials. The ILD layer may also comprise dense SiCOH or a porous dielectric having a k value of about 3 or lower, as examples. The ILD layer may also comprise an ultra-low k (ULK) material having a k value of about 2.3 or lower, for example. The ILD layer may comprise a thickness of about 500 nm or less, for example, although, alternatively, the ILD layer may comprise other dimensions.

As illustrated in FIG. 8b, in zones where the contact is to be made, the first insulating material layer 114 is etched down to the etch stop liner 112. In one exemplary process, photoresist (not shown) is deposited and patterned to mask off the nonexposed zones to the etch. The first insulating material layer 114 is then etched down to the etch stop liner 112 using standard etch techniques such as a reactive ion etch. In this step, the first insulating material layer 114 etches away at a faster rate than the etch stop liner 112. Once the etch is complete, the photoresist may be removed. Contact holes are formed by a second etch. This time, the etch stop liner 112 is etched to expose the silicide zones 58 using the first insulating material layer 114 as a mask.

As illustrated in FIG. 8b, a first conductive liner 115, may be deposited prior to filling the contact hole with a first conductive material. The first conductive liner 115 is preferably conformal, and may comprise a single layer of Ta, TaN, WN, WSi, TiN, Ru and combinations thereof, as examples. The first conductive liner 115 is typically used as a barrier layer for preventing metal from diffusing into the underlying semiconductor and first insulating material layer 114 material. These liners are deposited, for example, using a chemical vapor deposition (CVD), plasma vapor deposition (PVD) or Atomic layer Deposition (ALD) process.

Figure 8C:
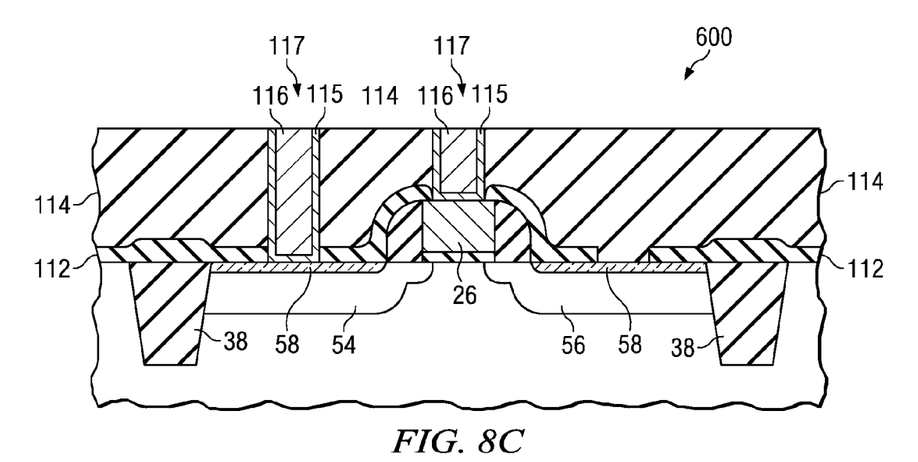

As illustrated in FIG. 8c, a first conductive material 116 is then deposited similarly using, for example, a CVD, PVD or ALD process over the first insulating material layer 114 and the first conductive liner 115 to fill the contact hole. Excess portions of the first conductive material 116 are removed from the top surface of the first insulating material layer 114, e.g., using a chemical-mechanical polishing (CMP) process forming at least one contact plug or via 117.

The first conductive material 116 preferably comprises tungsten, although copper, aluminum, Al—Cu—Si, other metals and combinations thereof may also be used. If the first conductive material 116 comprises tungsten, preferably a bi-layer seed layer comprising CVD titanium nitride and silicon doped tungsten are used. In some embodiments, the contact plug 117 is filled with copper, foregoing the titanium nitride liner (first conductive liner 115) which may be problematic in deeply scaled technologies.

Figure 8D:
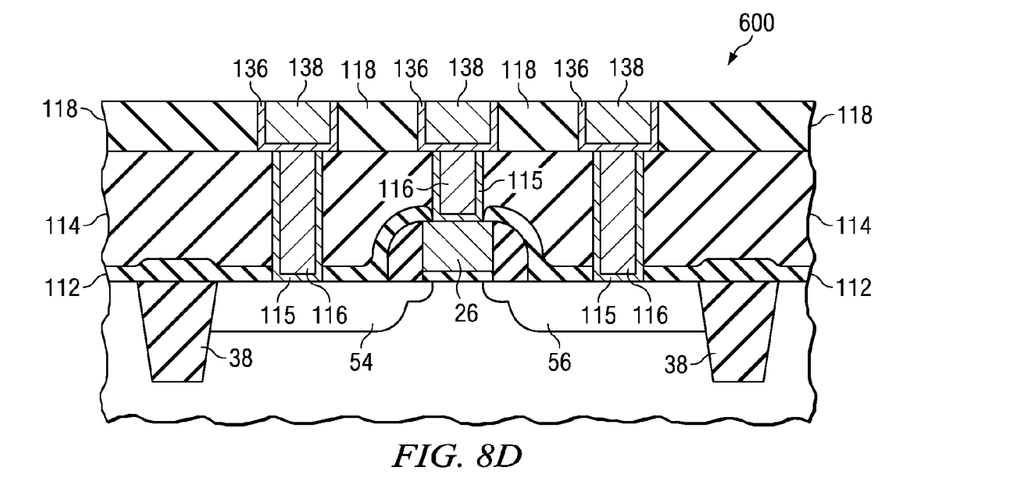

Referring now to FIG. 8d, a second insulating layer 118 is deposited over the first insulating layer 114. The second insulating layer 118 preferably comprises a low-k dielectric material having a dielectric constant of 3.6 or less, and may require heating, e.g., up to 400° C. to remove solvents. The second insulating layer 118 is patterned via lithography, e.g., with a mask. A photoresist is deposited over the second insulating layer 118, and portions of the photoresist are exposed, developed and removed, leaving a pattern for a metal line. The exposed second insulating layer 118 is removed to form openings in the second insulating layer 118.

A second conductive liner 136 is preferably deposited using a conformal deposition process, leaving a conformal liner or diffusion barrier 136 along the interior walls of the openings. Preferably the second conductive liner 136 comprises tantalum nitride deposited by plasma vapor deposition (PVD). Alternatively, the second conductive liner 136 may comprise titanium nitride, tungsten nitride, a refractory metal or other barrier layers that may be conformally deposited, for example, using CVD, PVD processes or electro-less plating. The second conductive liner 136 may comprise a bi-layer of material, including, for example, a barrier layer and a conformal seed layer, which preferably comprise copper, aluminum, other metals or combinations thereof. The seed layer may be deposited using a CVD or a PVD process, for example.

Figure 8E:
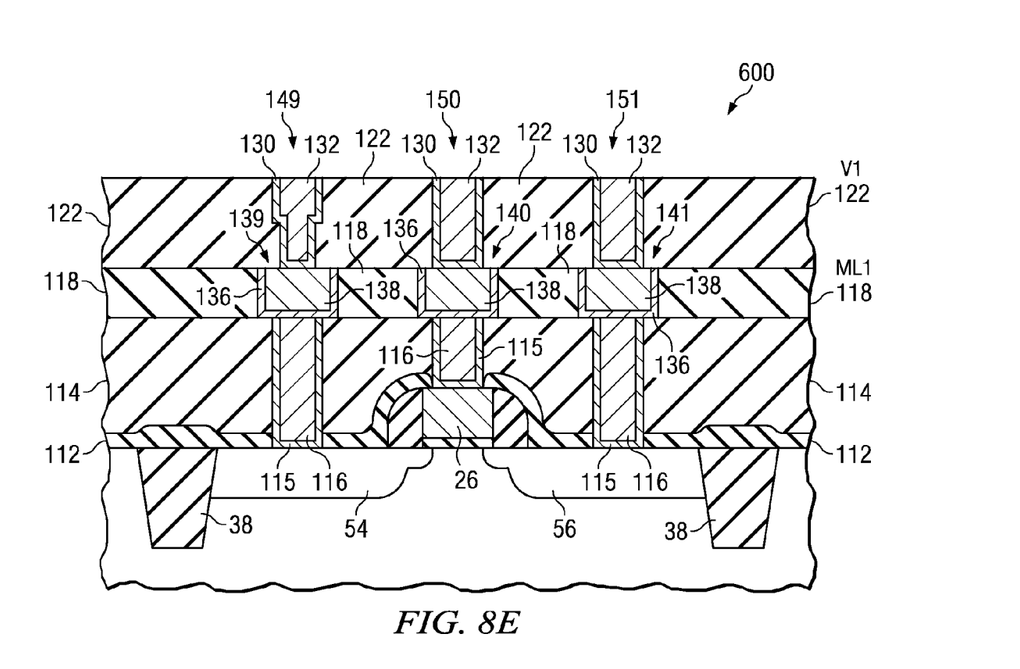

The remainder of the openings is filled with second conductive material 138, for example, using an embodiment of the invention of the electrochemical deposition process. As shown in FIG. 8e, the electrochemical deposition process creates a first metal line (ML1) having a portion residing within the second insulating layer 118 and a portion residing over the first insulating layer 114. The first metal line (ML1) includes a source metal line 139, a drain metal line 141 and a gate metal line 140. The second conductive material 138 preferably comprises copper, although it may comprise other metals such as gold, silver, and aluminum in other embodiments.

The electrochemical deposition process may be performed by biasing the anode 15 of FIG. 1a, the workpiece holder 12 of FIG. 1a, and the auxiliary electrode 30 of FIG. 1a using the embodiments described by, for example, the flow chart shown in FIG. 2. In preferred embodiments, the potential on the auxiliary electrode is less than the potential on the anode, although in other embodiments, they may be unrelated. The dimension (parallel to the surface of the workpiece) of the auxiliary electrode is similar to the dimension of the workpiece, although in other embodiments it may comprise other suitable dimensions.

The second conductive material 138 may be filled using either a single or multiple damascene process. In a single damascene process, a single layer of insulating material is patterned with a pattern for conductive features, such as conductive lines, conductive vias, or contacts, for example. In contrast, in a dual damascene process, the vias and metals lines are patterned for conductive features and filled in a single fill step with a conductive material. Although preferred embodiments use a double damascene process, embodiments of the present invention may also be formed in single or multiple damascene processes. In a multiple damascene process, three or more insulating material layers are patterned with patterns for conductive features and are later filled in a single fill step with a conductive material. Damascene processes are typically used when the conductive line material comprises copper, for example.

A third dielectric layer 122 may be deposited over the second dielectric layer 118 and first metal line 138 to form the first via level V1. For example, the third dielectric layer 122 may be patterned and etched to create via holes or openings. The via holes may be filled with a conductive liner 131 and a seed layer (not shown), followed by electroplating a conductive material, such as copper, to form vias 149, 150 and 151. The device at this stage is shown in FIG. 8e.

Further processing completes the formation of the semiconductor device 600. For example, further levels of metal lines and vias (metallization) ML2, V2, ML3, V3, ML4, V4, etc. (not shown) could proceed as discussed above by repeating the process for formation of metal lines 139-141, and vias 149-151. In some embodiments, the dimensions of the higher metal levels may be increased to reduce resistance of the metal lines.

It will be readily understood by those skilled in the art that materials and methods may be varied while remaining within the scope of the present invention. It is also appreciated that the present invention provides many applicable inventive concepts other than the specific contexts used to illustrate preferred embodiments. Accordingly, the appended claims are intended to include within their scope such processes, machines, manufacture, compositions of matter, means, methods, or steps.

What is claimed is:

1. A method of fabricating an integrated circuit, the method comprising:
    placing a workpiece under a workpiece holder, the workpiece holder disposed in a electro chemical deposition chamber and connected to a cathode electrode, the electro chemical deposition chamber further comprising a bottom electrode and at least one auxiliary electrode comprising a plurality of openings, the at least one auxiliary electrode disposed between the workpiece and the bottom electrode, wherein the at least one auxiliary electrode has a convex shape such that a first nearest distance is less than a second nearest distance and a third nearest distance is more than a fourth nearest distance, wherein the first nearest distance is the nearest distance from a center portion of the at least one auxiliary electrode to the workpiece, wherein the second nearest distance is the nearest distance from an edge portion of the at least one auxiliary electrode to the workpiece, wherein the third nearest distance is the nearest distance from the center portion of the at least one auxiliary electrode to the bottom electrode, and wherein the fourth nearest distance is the nearest distance from the edge portion of the at least one auxiliary electrode to the bottom electrode;

flowing an electrolyte comprising ionized atoms into the electro chemical deposition chamber, wherein the electro chemical deposition chamber comprises a diffuser configured to control the flow of the electrolyte and electric field lines in the electro chemical deposition chamber, and wherein the diffuser is disposed between the at least one auxiliary electrode and the bottom electrode, wherein the diffuser is separated physically from the at least one auxiliary electrode by a portion of the electrolyte; and powering the cathode electrode, the bottom electrode and the at least one auxiliary electrode, whereby the ionized atoms deposit over the workpiece, wherein the at least one auxiliary electrode is consumed when the ionized atoms deposit over the workpiece.

2. The method of claim 1, wherein the workpiece comprises a silicon wafer.

3. The method of claim 1, wherein the workpiece comprises a seed layer.

4. The method of claim 1, wherein the bottom electrode is connected to a first voltage source, the cathode electrode is connected to a second voltage source and the at least one auxiliary electrode is connected to at least one third voltage source.

5. The method of claim 1, wherein the at least one auxiliary electrode comprises electrically independent zones, wherein each zone is independently connected to a different voltage source.

6. A method of coating a film across a workpiece, the method comprising:

placing the workpiece in a chamber, wherein the workpiece is connected to a cathode electrode, the chamber further comprising a bottom anode and a plurality of auxiliary electrodes, the plurality of auxiliary electrodes being disposed between the workpiece and the bottom anode, wherein the plurality of auxiliary electrodes has a convex shape such that a first nearest distance is less than a second nearest distance and a third nearest distance is more than a fourth nearest distance, wherein the first nearest distance is the nearest distance from a center portion of the plurality of auxiliary electrodes to the workpiece, wherein the second nearest distance is the nearest distance from an edge portion of the plurality of auxiliary electrodes to the workpiece, wherein the third nearest distance is the nearest distance from the center portion of the plurality of auxiliary electrodes to the bottom anode, and wherein the fourth nearest distance is the nearest distance from the edge portion of the plurality of auxiliary electrodes to the bottom anode;

dividing each auxiliary electrode into concentric zones, wherein each zone corresponds to a zone of the workpiece;

measuring a thickness of the film in each zone of the workpiece; and powering the cathode electrode, the bottom anode, and the plurality of auxiliary electrodes to deposit the coating on the workpiece, wherein the plurality of auxiliary electrodes is consumed when depositing the coating on the workpiece, and wherein the plurality of auxiliary electrode and the bottom anode are a same material, wherein the chamber comprises a diffuser configured to control the flow of an electrolyte and electric field lines in the chamber, and wherein the diffuser is disposed between the plurality of auxiliary electrodes and the bottom anode, wherein the diffuser is separated physically from the plurality of auxiliary electrodes by a portion of the electrolyte.

7. The method of claim 6, further comprising:

measuring a signal through the plurality of auxiliary electrodes during deposition; and powering the plurality of auxiliary electrodes based on the measurement.

8. The method of claim 7, wherein measuring a signal comprises measuring a current through the plurality of auxiliary electrodes.

9. The method of claim 6, wherein dividing each auxiliary electrode into concentric zones comprises forming electrically independent zones.

10. The method of claim 6, wherein dividing each auxiliary electrode into concentric zones comprises changing a shape and configuration of each auxiliary electrode.

11. The method of claim 1, wherein the at least one auxiliary electrode comprises a mesh, wherein the mesh further comprises a network of connectors, wherein each connector comprises a curve element, and wherein the curve element has a plurality of widths.

12. The method of claim 11, wherein the at least one auxiliary electrode comprises stacked mesh layers.

13. The method of claim 12, wherein a number of mesh layers in the stacked mesh layers varies across the at least one auxiliary electrode.

14. The method of claim 12, wherein the stacked mesh layers of the auxiliary electrode are staggered between each layer.

15. A method of coating a film across a workpiece, the method comprising:

placing the workpiece in a chamber, wherein the workpiece is connected to a cathode electrode, the chamber further comprising a bottom anode and a plurality of auxiliary electrodes, the plurality of auxiliary electrodes being disposed between the workpiece and the bottom anode, wherein a nearest distance from the plurality of auxiliary electrodes to the workpiece varies from a center of the workpiece towards to an edge of the workpiece, and wherein the plurality of auxiliary electrodes comprises the same material as the bottom anode, wherein the plurality of auxiliary electrodes has a convex shape such that a first nearest distance is less than a second nearest distance and a third nearest distance is more than a fourth nearest distance, wherein the first nearest distance is the nearest distance from a center portion of the plurality of auxiliary electrodes to the workpiece, wherein the second nearest distance is the nearest distance from an edge portion of the plurality of auxiliary electrodes to the workpiece, wherein the third nearest distance is the nearest distance from the center portion of the plurality of auxiliary electrodes to the bottom anode, and wherein the fourth nearest distance is the nearest distance from the edge portion of the plurality of auxiliary electrodes to the bottom anode;

dividing each auxiliary electrode into concentric zones, wherein each zone corresponds to a zone of the workpiece;

measuring a thickness of the film in each zone of the workpiece; and powering the cathode electrode, the bottom anode, and the plurality of auxiliary electrodes to deposit a portion of the film on the workpiece, wherein the powering is selected based on the measured film thickness in each zone, and wherein the powering is selected to minimize a variation in the measured film thickness between each zone;

remeasuring the thickness of the film in each zone of the workpiece after the powering; and based on the remeasured film thickness, repowering the cathode electrode, the bottom anode, and the plurality of auxiliary electrodes to deposit a portion of the film on the workpiece, and wherein the repowering is selected to minimize a variation in the remeasured film thickness between each zone.

16. The method of claim 15, wherein the plurality of auxiliary electrodes is consumed when depositing the coating on the workpiece.

17. The method of claim 15, wherein a first nearest distance from the plurality of auxiliary electrodes to the center of the workpiece is smaller than a second nearest distance from the plurality of auxiliary electrodes to the edge.

18. The method of claim 17, wherein the concentric zones are coupled to the same potential node.

19. The method of claim 15, further comprising repeating the steps of measuring, powering, remeasuring, and repowering.

20. The method of claim 15, wherein the chamber comprises a diffuser configured to control the flow of an electrolyte and electric field lines in the chamber, and wherein the diffuser is disposed between the plurality of auxiliary electrodes and the bottom anode, wherein the diffuser is separated physically from the plurality of auxiliary electrodes by a portion of the electrolyte.

* * * * *